United States Patent
Kavusi et al.

(10) Patent No.: US 9,274,179 B2
(45) Date of Patent: Mar. 1, 2016

(54) INTEGRATED SENSOR ARRAY WITH OFFSET REDUCTION

(75) Inventors: Sam Kavusi, Menlo Park, CA (US);
Christoph Lang, Cupertino, CA (US);
Thomas Rocznik, Amstadt (DE);
Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 322 days.

(21) Appl. No.: 12/329,961

(22) Filed: Dec. 8, 2008

(65) Prior Publication Data
US 2010/0145657 A1 Jun. 10, 2010

(51) Int. Cl.
*G01D 18/00* (2006.01)
*G01R 33/00* (2006.01)
*G01R 33/07* (2006.01)

(52) U.S. Cl.
CPC .......... *G01R 33/0029* (2013.01); *G01D 18/008* (2013.01); *G01R 33/072* (2013.01); *G01R 33/075* (2013.01)

(58) Field of Classification Search
CPC .................................................. G01R 33/0029
USPC .......................................................... 702/85
See application file for complete search history.

(56) References Cited

U.S. PATENT DOCUMENTS

| | | | | |
|---|---|---|---|---|
| 4,025,941 A * | 5/1977 | Kanda | ................... | H01L 43/065 257/426 |
| 5,008,621 A * | 4/1991 | Jiles | ....................... | G01R 33/12 324/223 |
| 5,969,758 A * | 10/1999 | Sauer | ................... | H04N 5/3575 348/241 |
| 6,052,245 A * | 4/2000 | Sugawara | ................ | G11B 5/02 360/46 |
| 6,649,925 B2 * | 11/2003 | Talmi | ......................... | 250/559.1 |
| 6,724,187 B2 * | 4/2004 | Nix | ........................ | G01D 3/036 324/225 |
| 2003/0019468 A1 * | 1/2003 | Winner | ................... | B60T 8/885 123/319 |
| 2004/0066716 A1 * | 4/2004 | Yu | ........................ | G11B 7/0945 369/44.29 |
| 2005/0185797 A1 * | 8/2005 | Klein | .................. | H04R 29/005 381/59 |
| 2005/0258828 A1 | 11/2005 | Johnson et al. | | |
| 2006/0280268 A1 * | 12/2006 | Sobchak | .................. | H04B 1/30 375/349 |
| 2008/0158184 A1 * | 7/2008 | Land | .................... | G06F 3/0418 345/173 |

FOREIGN PATENT DOCUMENTS

EP 1720026 A1 11/2006
WO 0118556 A1 3/2001

OTHER PUBLICATIONS

Ratzlaff et al., "Computation of two-dimensional polynomial least-squares convolution smoothing integers," Anal. Chem. (1989).*

(Continued)

*Primary Examiner* — Hyun Park
(74) *Attorney, Agent, or Firm* — Maginot Moore & Beck LLP (57) ABSTRACT

A method and system for providing increased accuracy in a CMOS sensor system in one embodiment includes a plurality of sensor elements having a first terminal and a second terminal on a complementary metal oxide semiconductor substrate, a first plurality of switches configured to selectively connect the first terminal to a power source and to selectively connect the first terminal to a readout circuit, and a second plurality of switches configured to selectively connect the second terminal to the power source and to selectively connect the second terminal to the readout circuit.

20 Claims, 7 Drawing Sheets

(56) References Cited

OTHER PUBLICATIONS

European Search Report in related European patent application (i.e., EP 09 17 8340), dated Oct. 14, 2010 (2 pages).

Yeh et al., Mis-match Characterization of 1.8V and 3.3V Devices in 0.18um Mixed Signal CMOS Technology, Proc. IEEE 2001 Int. Conference on Microelectronic Test Structures, vol. 14, Mar. 2001, pp. 77-82 (6 pages).

* cited by examiner

INTEGRATED SENSOR ARRAY WITH OFFSET REDUCTION

FIELD

This invention relates to complementary metal oxide semiconductor sensors.

BACKGROUND

Complementary metal oxide semiconductor (CMOS) manufacturing processes are the most widely used semiconductor manufacturing processes and are recognized for their superior robustness and low cost in generating large volumes of product. Conventional CMOS processes are directed toward fabricating digital circuits, e.g., microprocessors, and the peripheral circuits, e.g., mixed-signal and radio frequency circuits. The use of CMOS sensors, however, has recently experienced rapid growth. CMOS sensors include image sensors, temperature sensors, and magnetic field sensors among many others. Additionally, many semiconductor sensors, such as pressure sensors or accelerometers, are either CMOS hybrids or CMOS systems monolithically integrated with microelectrical-mechanical systems (MEMS). Semiconductor sensors enable many new products and applications in automotive and consumer electronic market.

One major challenge in using CMOS processes for fabricating sensors is the limited absolute accuracy achieved with these sensors and the sensitivity of the devices to packaging and fabrication processes. For example, the offset in Hall sensors is influenced by the piezoresistance effect. The piezoresistance effect results from the mechanical stress on the chip which are not controlled in low cost packaging technologies, e.g., plastic packages as reported in Z. Randjelovic, "Low-power High Sensitivity Integrated Hall magnetic Sensor Microsystems," PhD Thesis, EPFL, 2000; and S. Bellekom, "Origins of Offset in Conventional and Spinning-current Hall Plates," PhD Thesis, Delft University, 1998. Similar effects limit the performance of many other sensors.

Layout techniques have been used in an attempt to mitigate various error sources. Mitigation techniques include manufacturing multiple devices on a single substrate with the theory that neighboring devices will cancel at least some of the errors introduced by the other device and/or the use of dummy devices. See, e.g., Z. Randjelovic; A. Hasting, "The Art of Analog Layout," Prentice Hall, 2005; and J. Frounchi et al., "Integrated Hall sensor array microsystem," ISSCC, p. 248-249, February 2001.

The effectiveness of the mitigation methods identified above is limited by constancy of the mechanical stress or process gradient on the chip. Specifically, to the extent the substrate exhibits a uniform gradient in a single dimension, neighboring devices will exhibit the same errors or offsets. Accordingly, by reversing the orientation of alternate devices, the offset realized in one device is eliminated by the reversed offset in the adjacent device.

In reality, however, sources of offset are not presented in a uniform gradient in a single dimension. Rather, the gradient varies within not only a single dimension, but in two dimensions, that is, both along the length of the substrate and the width of the substrate. Accordingly, neighboring devices exhibit different errors and the error of one device will not be completely cancelled by any one of the surrounding devices. Thus, sensor packages are typically costly and limited to use in applications depending on the offset tolerance of the application.

The non-linear stress exhibited by some sensors may be mitigated by other techniques. For example, the spinning current technique is generally used to cancel the remainder of offset errors in the specific case of Hall sensors. See, e.g., Bellekom; Frounchi; and J. van der Meer et al., "A Fully Integrated CMOS Hall Sensor with 3.65 µT 3σ Offset for Compass Applications," ISSCC, p. 246-247, February 2005. The increased accuracy attainable in these other techniques, however, is limited by second order effects such as Joule Heating, Seebeck, and Peltier effects. These additional techniques further require increased costs for front-end electronics.

A need exists for CMOS sensors with improved accuracy without a significant increase in cost.

SUMMARY

In accordance with one embodiment, a method and system for providing increased accuracy in a CMOS sensor system includes a plurality of sensor elements having a first terminal and a second terminal on a complementary metal oxide semiconductor substrate, a first plurality of switches configured to selectively connect the first terminal to a power source and to selectively connect the first terminal to a readout circuit, and a second plurality of switches configured to selectively connect the second terminal to the power source and to selectively connect the second terminal to the readout circuit.

In accordance with another embodiment, a method for providing increased accuracy in a complementary metal oxide semiconductor substrate (CMOS) sensor system, includes (a) establishing a first state condition by connecting a first terminal of a first of a plurality of sensor elements in an array of sensor assemblies on the CMOS substrate to an input, and connecting a second terminal of the first of the plurality of sensor elements to an output, (b) generating a first sensor element signal for the first state condition, (c) storing a first data associated with the first sensor element signal, (d) establishing a second state condition by connecting the first terminal of the first of a plurality of sensor elements to the output, and connecting the second terminal of the first of the plurality of sensor elements to the input, (e) generating a second sensor element signal for the second state condition, (f) storing a second data associated with the second sensor element signal, (g) performing (a)-(f) for each of the other of the plurality of sensor elements in the array of sensor assemblies, (h) calculating a plurality of offsets, each of the plurality of offsets associated with one of the plurality of sensor elements, using the stored first data and the stored second data, and (i) generating a sensor system output using the calculated plurality of offsets.

In yet another embodiment, a complementary metal oxide semiconductor (CMOS) sensor system includes a substrate with a power bus and a readout bus, a sensor array on the substrate and including a plurality of sensor assemblies, each of the plurality of sensor assemblies including a first sensor element with a first terminal and a second terminal, a first switch, and a second switch, a memory on the substrate including command instructions for (i) generating a first sensor assembly signal with each of the first sensor elements by connecting the first terminal to the input and connecting the second terminal to the output, (ii) storing for each of the first sensor assembly signals, a first data associated with the respective first sensor assembly signal, (iii) generating a second sensor assembly signal with each of the first sensor elements by connecting the first terminal to the output and connecting the second terminal to the input, (iv) storing for each of the second sensor assembly signals, a second data associated with the respective second sensor assembly signal, and (v) calculating a respective offset for each of the plurality of sensor assemblies using the associated first data and associated second data, and a processor for executing the command instructions.

DESCRIPTION

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Figure 1:
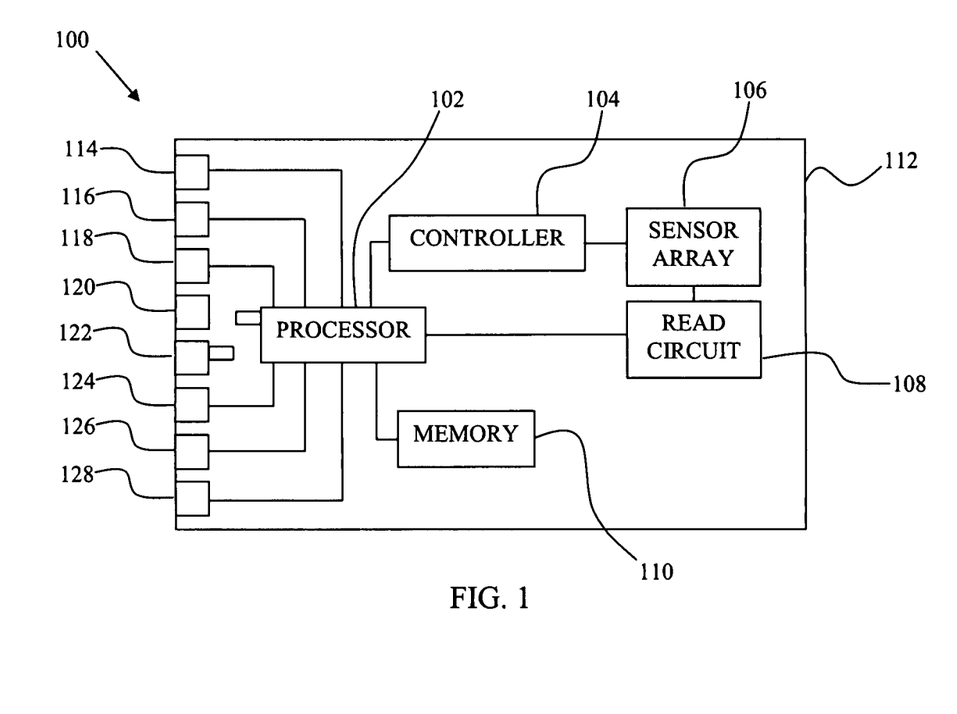
FIG. 1 depicts a schematic of a substrate including a processor, a memory, a sensor array and a readout circuit in accordance with principles of the present invention.

FIG. 1 depicts a CMOS sensor 100 which includes a processor or digital signal processing block 102, a controller 104, a sensor array 106, a readout circuit 108 and a memory 110. The processor 102, controller 104, sensor array 106, readout circuit 108 and memory 110 in this embodiment are all located on a substrate 112. In alternative embodiments, various combinations of the components are located remote from the sensor array 106. A positive power terminal 114 and a negative power terminal 116 are also provided on the substrate 112 along with other terminals 118, 120, 122, 124, 126, and 128 which may be used for power, communications, control, and other connections. More or fewer pins may be provided.

Figure 2:
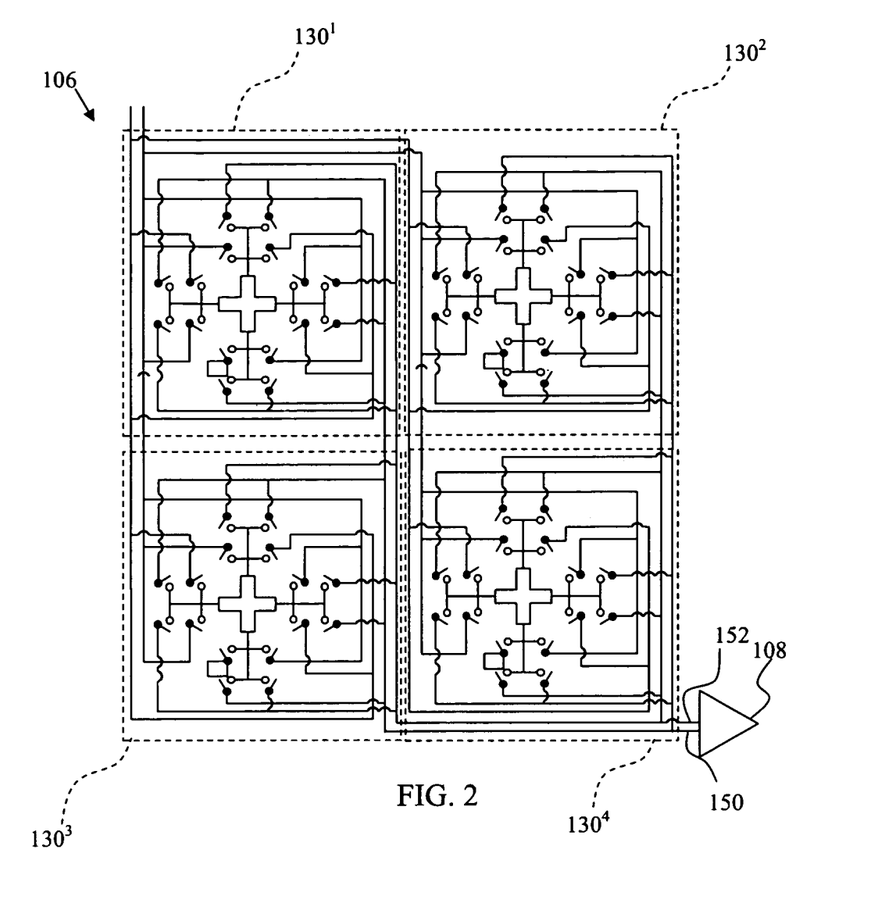
FIG. 2 depicts a schematic of the sensor array and readout circuit of FIG. 1 including four sensor assemblies, each sensor assembly including four sets of switches that can be used to establish different state conditions for the sensor element in the sensor assembly.

With reference to FIG. 2, the sensor array 106 includes four sensor assemblies $130^{1-4}$. While only four sensor assemblies $130^x$ are shown in the embodiment of FIG. 1, more sensor assemblies $130^x$ may be included on a substrate if desired. Each of the sensor assemblies $130^{1-4}$ in FIG. 2 are identical and are described with reference to sensor assembly $130^1$ which is shown more clearly in FIG. 3.

Figure 3:
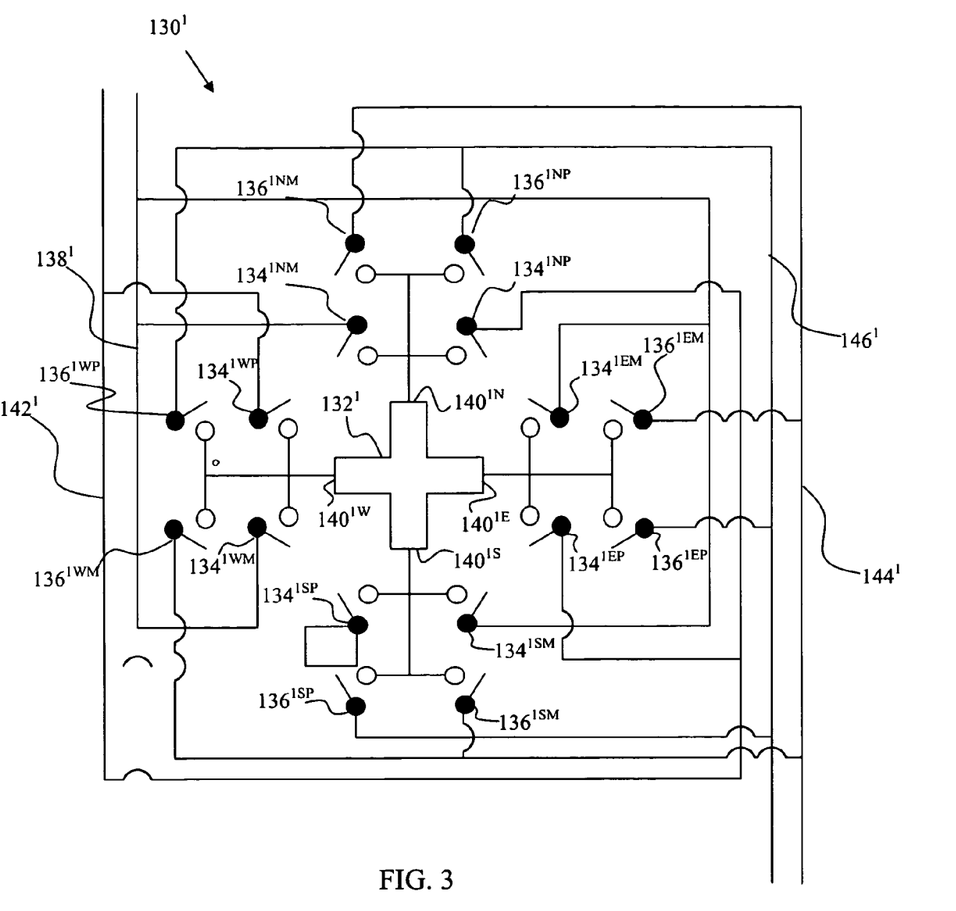
FIG. 3 depicts one of the sensor assemblies of FIG. 2.

The sensor assembly $130^1$ includes a sensor element $132^1$, eight power switches $134^{1NM}$, $134^{1NP}$, $134^{1SM}$, $134^{1SP}$, $134^{1EM}$, $134^{1EP}$, $134^{1WM}$, and $134^{1WP}$ and eight readout switches $136^{1NW}$, $136^{1NP}$, $136^{1SM}$, $136^{1SP}$, $136^{1EM}$, $136^{1EP}$, $136^{1WM}$, and $136^{1WP}$. Each of the switches $134^{1XM}$ can be individually controlled by the controller 104 to operably connect the sensor element $132^1$ to a negative bias bus $138^1$ through any of four sensor element terminals $140^N$, $140^E$, $140^S$, or $140^W$ and each of the switches $134^{1XP}$ can be individually controlled by the controller 104 to operably connect the sensor element $132^1$ to a positive bias bus $142^1$ through any of the four sensor element terminals $140^{1N}$, $140^{1F}$, $140^{1S}$, or $140^{1W}$. The negative bias bus $138^1$ is operably connected to the negative bias terminal 116 and the positive bias bus $142^1$ is operably connected to the positive bias terminal 114.

Additionally, each of the switches $136^{1XM}$ can be individually controlled by the controller 104 to operably connect the sensor element $132^1$ to a negative readout bus $144^1$ through any of the four sensor element terminals $140^{1N}$, $140^{1E}$, $140^{1S}$, or $140^{1W}$ and each of the switches $136^{1XP}$ can be individually controlled by the controller 104 to operably connect the sensor element $132^1$ to a positive readout bus $146^1$. The negative readout bus $144^1$ is operably connected to a negative input 150 of the readout circuit 108 and the positive readout bus $146^1$ is operably connected to a positive input 152 of the readout circuit 108 as shown in FIG. 2.

Specifically, the processor 102 executes command instructions which are stored in the memory 110 to command the controller 104 to sequentially connect a sensor element terminal $140^{XX}$ in each of the sensor assemblies $130^{1-4}$ to the positive power terminal 114 through a positive power supply bus $142^X$ and another sensor element terminal $140^{XX}$ to the negative power terminal 116 through a negative power supply bus $138^X$. In conjunction, the processor 102 executes command instructions which are stored in the memory 110 to command the controller 104 to sequentially connect another of the sensor element terminals $140^{XX}$ in each of the sensor assemblies $130^{1-4}$ to the positive input 152 of the readout circuit 108 through a positive readout bus $146^X$ to the positive input 152 of the readout circuit 108 through a positive readout bus $146^X$ and another sensor element terminal $140^{XX}$ to the negative input 150 of the readout circuit 108 through a negative readout bus $144^X$.

By controlling the particular combination of power switches $134^{1SM}$, $134^{1NP}$, $134^{1SM}$, $134^{1SP}$, $134^{1EM}$, $134^{1EP}$, $134^{1WM}$, and $134^{1WP}$, and readout switches $136^{1NM}$, $136^{1NP}$, $136^{1SM}$, $136^{1SP}$, $136^{1EM}$, $136^{1EP}$, $136^{1WM}$, and $136^{1WP}$ which are used to connect the sensor element terminals $140^{XX}$ to the negative power supply bus $138^X$, the positive power supply bus $142^X$, the negative readout bus $144^X$, and the positive readout bus $146^X$, the state of the respective sensor element $122^X$ can be varied and sensed as described more fully below. The state may simply be different polarities, or different directions of current flow. Alternatively, different states may be effected by control of other onchip (or offchip) sources. By way of example, coils or resistors may be used to generate a particular magnetic field or heat.

The output of the sensor array 106 is provided to the readout circuit 108 which may include biasing components, a programmable amplifier, and an analog-to-digital converter. The output of the readout circuit 108 is in turn provided to the processor 102. The output provided to the processor 102 is used to estimate the offset for each device and to perform an adaptive calibration of the output of the sensor array 106.

Figure 4:
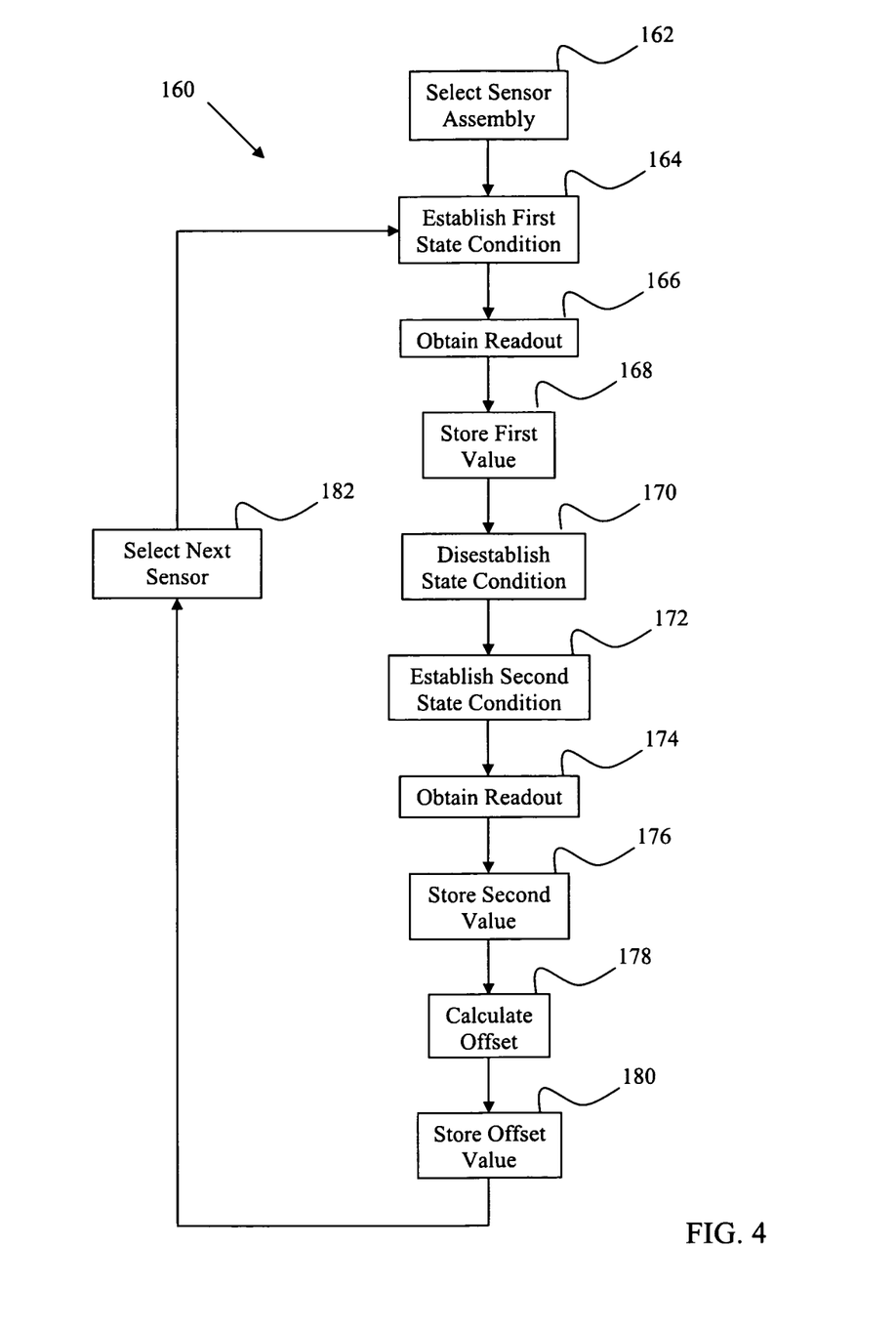
FIG. 4 depicts a process that may be controlled by the processor of FIG. 1 for obtaining offset values for each of the sensor assemblies in the sensor array.
Figure 5:
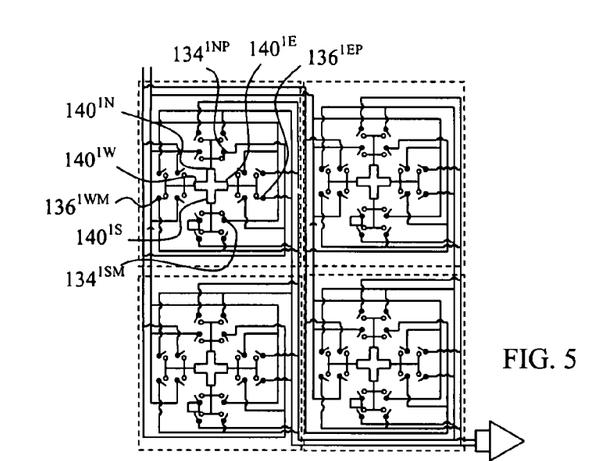
FIGS. 5-8 depict the sensor array schematic of FIG. 2 showing different sensors configured in different states in accordance with the process of FIG. 4.

The offset estimation process 160 of FIG. 4 begins at 162 with the selection of a sensor assembly $130^x$. For this example, the sensor assembly $130^x$ that is initially selected is sensor assembly $130^1$. At block 164, a state condition is established. In this embodiment, the sensor elements $132^X$ are Hall Effect sensors. Accordingly, a first state condition may be established by controlling the power switches $134^{1NP}$ and $134^{1SM}$ to connect to the terminals $140^{1N}$ and $140^{1S}$, respectively. Additionally, the readout switches $136^{1EP}$ and $136^{1WM}$ are controlled to connect to the terminals $140^{1E}$ and $140^{1W}$, respectively. This configuration is shown in FIG. 5.

At the block 166, the processor 102 controls the readout circuit 108 to obtain the output of the sensor assembly $130^1$. The data corresponding to the output obtained by the readout circuit 108 is then stored in the memory 110 at the block 168.

Figure 6:
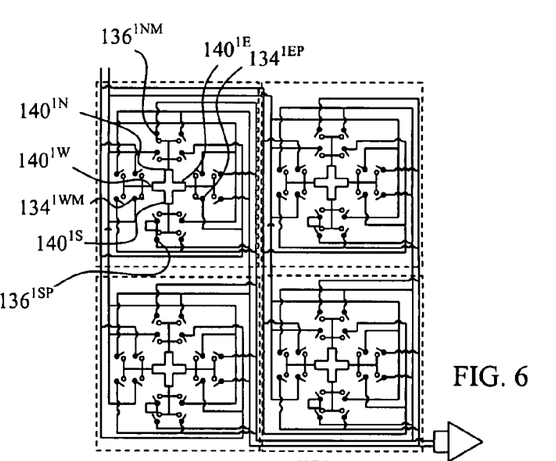

At the block 170 the power switches $134^{1NP}$ and $134^{1SM}$ are controlled to disconnect from the terminals $140^{1N}$ and $140^{1S}$, respectively. In one embodiment, each sensor assembly $130^X$ is selected and the first condition established prior to establishing a second state condition. In the embodiment of FIG. 4, however, a second state condition for the sensor assembly $130^1$ is established by controlling the power switches $134^{1EP}$ and $134^{1WM}$ to connect to the terminals $140^{1E}$ and $140^{1W}$, respectively. Additionally, the readout switches $136^{1SP}$ and $136^{1NM}$ are controlled to connect to the terminals $140^{1S}$ and $140^{1N}$, respectively. This configuration for the sensor assembly $130^1$ is shown in FIG. 6. Accordingly, the state of the sensor assembly $130^1$ is modified from the state associated with FIG. 5.

At the block 174, the processor 102 controls the readout circuit 108 to obtain the output of the sensor assembly $130^1$. The data corresponding to the output obtained by the readout circuit 108 is then stored in the memory 110 at the block 176.

With two values from the sensor assembly $130^1$ at different states, the offset of the sensor assembly $130^1$ may be determined at the block 178. Offset may be calculated using the following equation:

$$o_{i,j} = o_{i,j}^1 - o_{i,j}^2$$

wherein
"i" is the column of the array that the sensor is in,
"j" is the row of the array that the sensor is in,
"1" identifies a first state, and
"2" identifies a second state.

Figure 7:
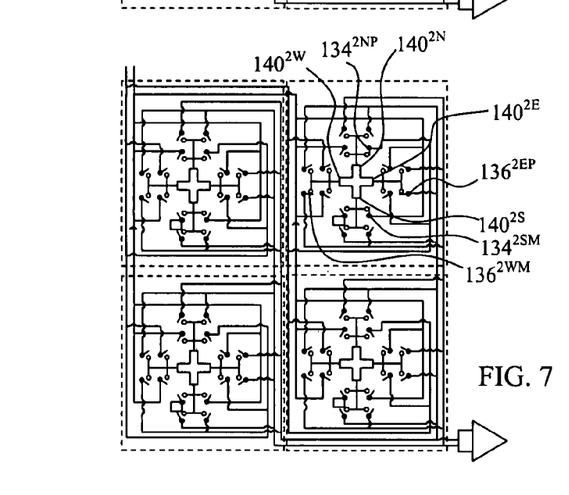
Figure 8:
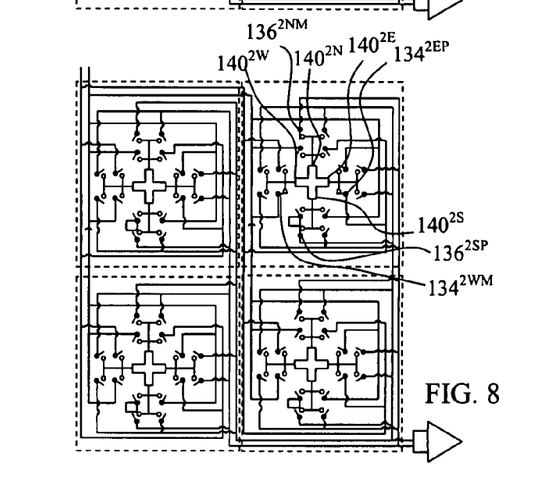

The value of the offset determined at the block 178 is stored in the memory 110 at the block 180. The next sensor assembly is then selected at the block 182, and a first state condition is established for the selected sensor assembly at the block 184. By way of example, FIG. 7 shows a state condition established for the sensor assembly $130^2$ by controlling the switches $134^{2NP}$ and $134^{2SM}$ to connect to the terminals $140^{2N}$ and $140^{2S}$, respectively. Additionally, the readout switches $136^{2EP}$ and $136^{2WM}$ are controlled to connect to the terminals $140^{2E}$ and $140^{2W}$, respectively. The second state for the sensor assembly $130^2$ is shown in FIG. 8 with the power switches $134^{2EP}$ and $134^{2WM}$ connected to the terminals $140^{1E}$ and $140^{1W}$, respectively. Additionally, the readout switches $136^{2SP}$ and $136^{2NM}$ are controlled to connect to the terminals $140^{2S}$ and $140^{2N}$, respectively.

The offset calculation process 160 continues until data is available for all of the sensor assemblies $130^x$. The offset calculation process 160 then continues with the first sensor assembly $130^X$ and continues to provide updated offset values for each of the sensor assemblies $130^X$. Continued updating of the offset values for each of the sensor assemblies $130^x$ provides increased accuracy. The offset values, however, may include a significant noise element. Thus, the offset values obtained in the first and second state are described by the following equations:

$$o_{i,j}^1 = v_h + v_{i,j}^{offset} + \text{noise}$$

$$o_{i,j}^2 = v_h - v_{i,j}^{offset} + \text{noise}$$

wherein
$v_h$ corresponds to Hall voltage, and
$v^{offset}$ corresponds to offset voltage.

Accordingly, performing $o_{i,j}^1 - o_{i,j}^2$ as described at block 178 results in offset with a high noise component. The effect of noise and other errors on the accuracy of the output of the sensor 100 is mitigated by applying a robust polynomial 2-D least-squares fit of the offset data for the sensor array 106. The command instructions for the polynomial 2-D least-squares fit may be stored in the memory 110 for execution by the processor 102. Execution of the command instructions for the polynomial 2-D least-squares fit provides a smoothed offset value ($\hat{o}_{i,j}$), for each sensor element. The smoothed offset value exhibits reduced inaccuracies caused by noise, including the 1/f component, as compared to the offset values.

In one embodiment, the smoothed offset value is used to identify sensor assemblies $130^X$ which exhibit very high offsets. The least squares fit may be improved by either ignoring the abnormally high value or substituting a normalized value for the particular sensor assembly $130^X$ to generate a corrected smoothed offset value. A correlation detector may be used to evaluate packaging properties by calculating the uniformity of the mechanical stress. The corrected smoothed offset value thus reduces the effect of non-stress related inaccuracies of a single sensor assembly on the calculated smoothed offset value of adjacent sensors. Additionally or alternatively, the output from the sensor assemblies $130^X$ exhibiting abnormally high offset may be excluded from the sensor array output.

The smoothed offset value, corrected or non-corrected, is applied by the processor 102 in generating an output signal on a selected one of the terminals 118, 120, 122, 124, 126, or 128. Specifically, there will generally be at least two output values stored in the memory 110 for each of the sensor assemblies $130^X$, one value for each of the state conditions stored at the blocks 168 and 176 of FIG. 4. At a predetermined interval, the processor 102 obtains the two most recently stored outputs for each of the sensor assemblies $130^X$. The smoothed offset value associated with the respective sensor assembly $130^X$ is then applied to the most recent sensor assembly $130^X$ outputs to produce a corrected sensor assembly output for the respective sensor assembly $130^X$.

The corrected sensor assembly outputs for each of the sensor assemblies $130^X$ are then added together and divided by the number of sensor assemblies $130^X$ to produce an offset canceled output for the sensor 100. In this embodiment, the offset canceled output is calculated using the following formula:

$$O_{\text{offset\_canceled}} \propto \frac{1}{n^2} \sum_{i=1}^{n} \sum_{j=1}^{n} (o_{i,j}^1 - \hat{o}_{i,j})$$

In an another embodiment, the foregoing procedure is modified by using only the most recently stored output for each sensor assembly $130^X$ for the most recent state conditions. In this embodiment, the value for $\hat{o}_{i,j}$ is modified to reflect the use of a single measurement through each of the sensor elements.

Some sensors are subjected to environments which produce varying gain factors, e.g., different temperatures. In such unstable temperature environments, an offset canceled output may be generated by using a weighted average of the sensor assembly outputs. A weighted average offset canceled output may be calculated using the formula set forth below:

$$O_{\text{offset\_normalized}} \propto \frac{1}{n^2} \sum_{i=1}^{n} \sum_{i=1}^{n} \frac{(o_{i,j}^1 + o_{i,j}^2)}{\delta_{i,j}}$$

Thus, because the offset is determined and corrected digitally, as opposed to depending upon the offset signal of one sensor to cancel the offset signal of an adjacent sensor with a reverse polarity, the offset correction may be tailored to the particular sensor environment.

Figure 9:
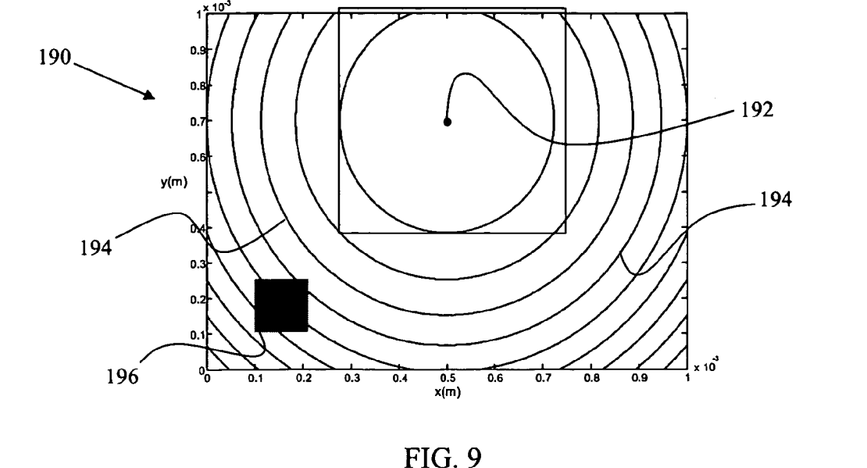
FIG. 9 depicts the location of a sensor array on a substrate that exhibits a stress gradient that varies in two dimensions.

Principles of the embodiments were validated as discussed with reference to FIGS. 9-11. With initial reference to FIG. 9, a substrate 190 is subjected to a stress with an origin 192 that is not centered on the substrate 190. The stress at the origin 192 was simulated at 80 MPa. Each isobar 194 indicates a 5 MPa decrease in the stress, with the stress at the lower corners (as viewed in FIG. 9) being 30 MPa. A location 196 was selected for placement of a 2×2 array (not shown). The 2×2 array was oriented to fit within the location 196. The four sensors in the 2×2 array were connected in parallel pairs, each of the sensors in a pair having a polarity opposite to the polarity of the other sensor in the pair in order to cancel the offset of the paired sensor.

Figure 10:
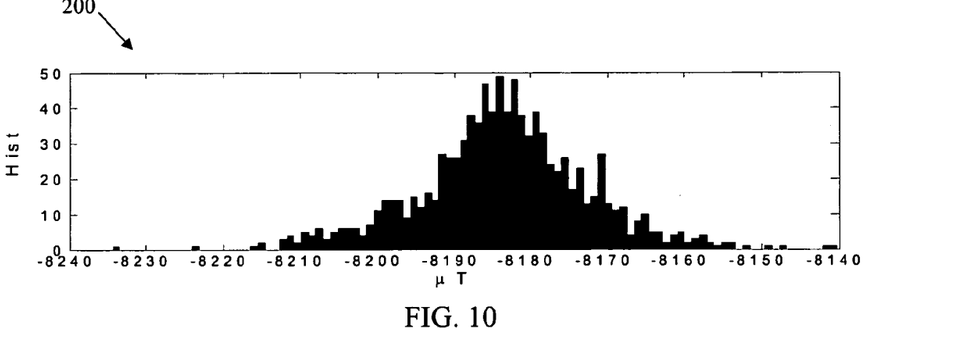
FIG. 10 depicts a histogram of the output of a 2×2 sensor array incorporating traditional offset cancelation techniques.
Figure 11:
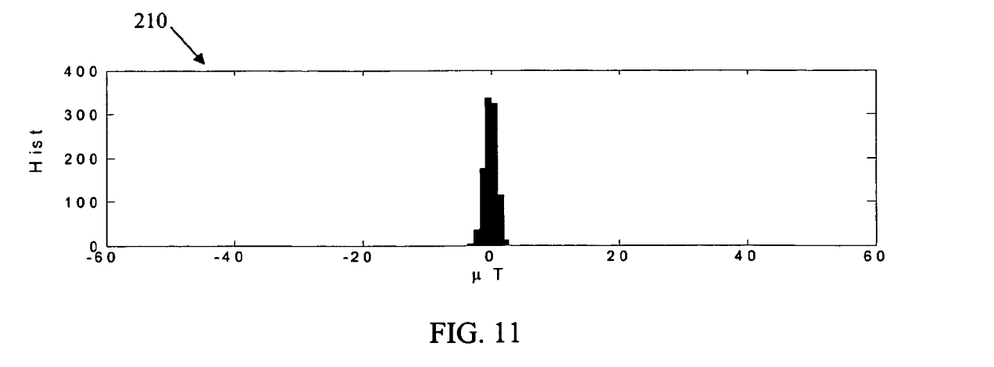
FIG. 11 depicts a histogram of the output of a 16×16 sensor array incorporating principles of the invention.

The 2×2 array was then sampled 1000 times with the offset correction effected by the reversed polarities and the results plotted on the histogram 2000 of FIG. 10. The X-axis of the histogram 200 identifies the sensed magnetic field in micro-Tesla (μT) for the 2×2 array. The Y-axis identifies the number of samples, each sample being an average of the 4 sensors in the 2×2 array, which were obtained at the associated level. FIG. 10 reveals a standard deviation of 1.2 μT centered on about −8184 μT, with about 60% of the samples between about −8175 μT and −8192 μT.

A 16×16 array was then oriented to fit within the location 196. The 256 sensors in the 16×16 array were operated using the procedure discussed with reference to FIG. 4, and 1000 smoothed offset values were obtained. Each of the 1000 smoothed offset values represented the average smoothed offset value of the 256 sensors in the 16×16 array.

The results of the 1000 samples of the 16×16 array are plotted on the histogram 210, which has the same axes as the histogram 200. FIG. 10 reveals a standard deviation of 96 ηT centered upon 4 ηT, with more than 60% of the samples within ±0.1 μT of 0.0 μT.

Thus, by generating a smoothed offset value, the offset in the sensor output resulting from a non-linear stress is reduced by four orders of magnitude and the spread is likewise significantly reduced.

Of course, the foregoing examples discussed the use of only two possible states for the sensor assemblies $130^x$. Additional accuracy may be obtained by incorporating additional switch configurations to provide additional state conditions. Moreover, while the state conditions for the sensor array 106 were varied by switching the polarity of the individual sensor elements $132^x$ using the switches $134^{xxx}$, state conditions for other types of sensors, including pressure and optical sensors, may be modified using other devices which may or may not be located on the same substrate as the sensor array.

Additional increases in accuracy may be obtained in a variety of ways. By way of example, a smoothed offset value may be combined with an extra reference or a factory side calibration. The accuracy of the smoothed offset value may also be enhanced by applying a strong source (e.g., high magnetic field) either by an external source or by on-chip actuators (e.g., coils) during offset determination. In magnetic sensor embodiments incorporating a coil, the coil may further be used to perform a gain calibration.

Moreover, the process of FIG. 4 may be modified to obtain readings of the sensors at different currents. Analysis of the readings obtained at different current levels may be used to isolate the offset which results from the "Seebeck effect" since the Seebeck effect is a third order term in the offset expression which is a function of bias current in a Hall sensor.

The smoothed offset value may be further refined in sensor arrays incorporating sensor elements of different types. By way of example, the sensor array 230 of FIG. 12 includes four sensor assemblies $232^{1-4}$. The sensor assemblies $232^{1-4}$ may be powered by positive and negative power buses 234 and 236, respectively, and readouts from the sensor assemblies $232^{1-4}$ are obtained by positive and negative readout buses 238 and 236, respectively.

Figure 12:
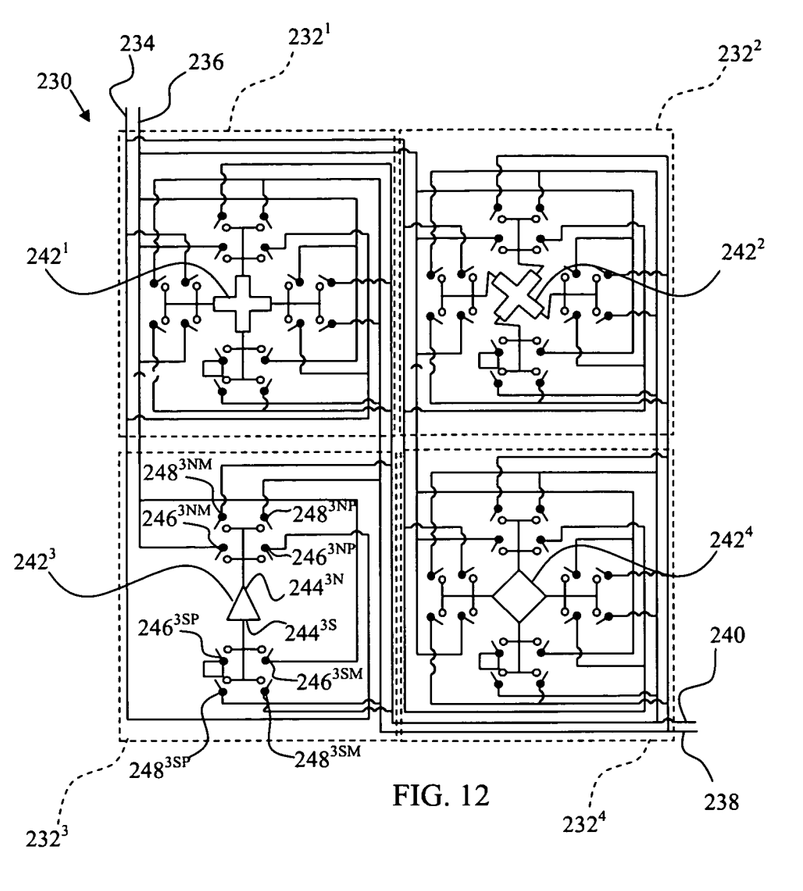
FIG. 12 depicts a schematic of an alternative sensor assembly including eight switches that can be used to establish different state conditions for three different sensor elements in the sensor assembly.

The sensor assemblies $232^{1-4}$ include sensor elements $242^{1-4}$. The sensor element $242^1$ and $242^2$ are both Hall Effect sensors while the sensor element $242^3$ is a diode sensor element and the sensor element $242^4$ is a strain sensor element. The power and readout switches for the sensor assemblies $232^1$, $232^2$, and $232^4$ are substantially the same as the power and readout switches for the sensor assemblies $130^x$. The main difference between the sensor assemblies $232^1$ and $232^2$ is that the sensor assembly $232^2$ is angularly rotated on the sensor array 230. The sensor assembly $232^3$ differs from the other sensor assemblies in that the sensor element $242^3$ has only two terminals, $244^{3N}$ and $244^{3S}$. Accordingly, only four power switches $246^{3NM}$, $246^{3NP}$, $246^{3SM}$ and $246^{3SP}$ are incorporated for establishing different state conditions. Similarly, only four readout switches $248^{3NM}$, $248^{3NP}$, $248^{3SM}$ and $248^{3SP}$ are incorporated for obtaining sensor signals from the sensor element $242^3$.

The sensor array 230 may be controlled to act as a dedicated optical sensor, a dedicated hall sensor, a temperature sensor, or a dedicated strain sensor. Alternatively, the sensor array 230 may be controlled to act as a multi-sensor. The sensor array 230 may further be controlled to distinguish between different types of errors across an array of the sensor assemblies $232^x$. For example, distinctions may be obtained between offsets caused by temperature gradients on the chip and offsets caused by stress gradients on the chip. This information may be used in calibrating the sensor array 230 or the data may be stored for later analysis of the performance of the sensor array 230.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A magnetic field sensor system, comprising:
a plurality of sensor elements having a first terminal and a second terminal on a complementary metal oxide semiconductor substrate;
a first plurality of switches configured to selectively connect the first terminal to a power source and to selectively connect the first terminal to a readout circuit; and
a second plurality of switches configured to selectively connect the second terminal to the power source and to selectively connect the second terminal to the readout circuit, characterized in that the magnetic field sensor system further includes:

a memory including command instructions for (i) individually establishing a first state condition for each of the plurality of sensor elements by connecting the first terminal to the power source and connecting the second terminal to the readout circuit for each of the plurality of sensor elements, (ii) generating, with each of the plurality of sensor elements, a first state condition signal, (iii) storing, for each of the plurality of sensor elements, a first data associated with the generated first state condition signal, (iv) individually establishing a second state condition for each of the plurality of sensor elements by connecting the first terminal to the readout circuit and connecting the second terminal to the power source for each of the plurality of sensor elements, (v) generating, with each of the plurality of sensor elements, a second state condition signal, (vi) storing, for each of the plurality of sensor elements, a second data associated with the generated second state condition signal, (vii) calculating, for each of the plurality of sensor elements, a calculated offset using the stored first data and the stored second data, (viii) calculating a smoothed offset for at least one of the plurality of sensor elements based upon the calculated offsets, (ix) excluding from the smoothed offset calculation a calculated offset that is not within a predetermined range of offsets, the predetermined range of offsets based upon the calculated offsets for each of the plurality of sensor elements, and (x) generating a magnetic field sensor system signal based upon calculated offsets which are not excluded; and a processor for executing the command instructions.

2. The magnetic field sensor system of claim 1, the memory further including command instructions for:

identifying a polynomial two-dimensional least-squares fit for the calculated offsets which are not excluded;

calculating a smoothed offset for each of the plurality of sensor elements based upon the polynomial two-dimension least-squares fit;

determining the magnetic field sensor system signal based upon the first data for each of the plurality of sensor elements and the calculated smoothed offset for each of the plurality of sensor elements; and outputting the magnetic field sensor system signal.

3. The magnetic field sensor system of claim 2, the memory further including command instructions for:

comparing the calculated offset of each of the plurality of sensor elements to the smoothed offset for each of the plurality of sensor elements;

determining, based upon the comparison, if the calculated offset for each of the plurality of sensor elements is within a predetermined range of the smoothed offset for each of the plurality of sensor elements; and excluding first data from each of the plurality of sensor elements having a calculated offset that is not within the predetermined range of the respective smoothed offset for each of the plurality of sensor elements.

4. The magnetic field sensor system of claim 1, wherein the plurality of sensor elements comprise a plurality of Hall sensor elements.

5. The magnetic field sensor system of claim 4, wherein the plurality of sensor elements further comprise one or more of a diode sensor element and a strain sensor element.

6. The magnetic field sensor system of claim 1, further comprising:

a third plurality of switches configured to selectively connect a third sensor element terminal to the power source and to selectively connect the third sensor element terminal to the readout circuit; and a fourth plurality of switches configured to selectively connect a fourth sensor element terminal to the power source and to selectively connect the fourth sensor element terminal to the readout circuit.

7. A method for providing increased accuracy in a complementary metal oxide semiconductor substrate (CMOS) magnetic field sensor system, comprising:

(a) establishing a first state condition by connecting a first terminal of a first of a plurality of sensor elements in an array of sensor assemblies on the CMOS substrate to an input, and connecting a second terminal of the first of the plurality of sensor elements to an output;

(b) generating a first sensor element signal for the first state condition;

(c) storing a first data associated with the first sensor element signal;

(d) establishing a second state condition by connecting the first terminal of the first of a plurality of sensor elements to the output, and connecting the second terminal of the first of the plurality of sensor elements to the input;

(e) generating a second sensor element signal for the second state condition;

(f) storing a second data associated with the second sensor element signal;

(g) performing (a)-(f) for each of the other of the plurality of sensor elements in the array of sensor assemblies;

(h) calculating a plurality of calculated offsets, each of the plurality of calculated offsets associated with one of the plurality of sensor elements, using the stored first data and the stored second data;

(i) calculating a smoothed offset based upon the calculated offsets;

(j) using a normalized offset value in calculating the smoothed offset calculation for a calculated offset that is not within a predetermined range of offsets, the predetermined range of offsets based upon the calculated offsets for each of the plurality of sensor elements; and (k) generating a magnetic field sensor system signal based upon the smoothed offset calculation.

8. The method of claim 7, further comprising:

(l) identifying a polynomial two-dimension least-squares fit for the plurality of calculated offsets;

(m) calculating a smoothed offset for each of the plurality of sensor elements based upon the polynomial two-dimension least-squares fit; and (n) generating the magnetic field sensor system output using the smoothed offset for each of the plurality of sensor elements.

9. The method of claim 8, further comprising:

(o) comparing, for each of the plurality of sensor elements, the associated one of the plurality of calculated offsets to the associated smoothed offset;

(p) identifying each of the plurality of sensor elements with a calculated offset that is not within a predetermined range of the associated smoothed offset, wherein (n) comprises:

generating the magnetic field sensor system output that does not include the first data from each of the plurality of sensor elements identified in (p).

10. The method of claim 8, wherein (n) comprises:

generating the magnetic field sensor system output using a weighted average of the smoothed offset for each of the plurality of sensor elements.

11. The method of claim 8, wherein (n) comprises:

generating the magnetic field sensor system output by subtraction of the smoothed offset for each of the plurality of sensor elements.

12. The method of claim 8, further comprising:
(o) establishing a third state condition by connecting a third terminal of the first of the plurality of sensor elements to the input, and connecting a fourth terminal of the first of the plurality of sensor elements to the output;
(p) generating a third sensor element signal for the third state condition;
(q) storing a third data associated with the third sensor element signal;
(r) establishing a fourth state condition by connecting the third terminal of the first of a plurality of sensor elements to the output, and connecting the fourth terminal of the first of the plurality of sensor elements to the input;
(s) generating a fourth sensor element signal for the fourth state condition;
(t) storing a fourth data associated with the second sensor element signal;
(u) performing (o)-(t) for each of the other of the plurality of sensor elements in the array of sensor assemblies, wherein (h) further comprises:
calculating a plurality of calculated offsets associated with one of the plurality of sensor elements using the stored third data and the stored fourth data.

13. The method of claim 7, wherein the plurality of sensor elements comprises at least two sensor elements selected from the group consisting of:
at least one Hall sensor element;
at least one diode sensor element; and
at least one strain sensor element.

14. The method of claim 7, further comprising:
(l) modifying the first state condition by changing a bias applied to the first of the plurality of sensor elements;
(m) generating a first modified sensor element signal for the first modified state condition;
(n) storing a first modified data associated with the first modified sensor element signal; and
(o) determining an offset component based upon the first data and the first modified data.

15. The method of claim 7, wherein (a) comprises:
applying a source to the first of the plurality of sensor elements.

16. A magnetic field sensor system, comprising:
a plurality of sensor elements including at least two Hall Effect sensors and one or more of a diode sensor element and a strain sensor element, each of the plurality of sensor elements having a first terminal and a second terminal on a complementary metal oxide semiconductor substrate;
a first plurality of switches configured to selectively connect the first terminal to a power source and to selectively connect the first terminal to a readout circuit; and
a second plurality of switches configured to selectively connect the second terminal to the power source and to selectively connect the second terminal to the readout circuit;
a memory including command instructions for (i) calculating, for each of the plurality of sensor elements, a respective calculated offset, (ii) generating a smoothed offset based upon the respective calculated offsets, and (iii) excluding from the smoothed offset generation a calculated offset that is not within a predetermined range of offsets, the predetermined range of offsets based upon the respective calculated offsets for each of the plurality of sensor elements; and
a processor for executing the command instructions.

17. The magnetic field sensor system of claim 16, the memory further including command instructions for:
(i) individually establishing a first state condition for each of the plurality of sensor elements by connecting the first terminal to the power source and connecting the second terminal to the readout circuit for each of the plurality of sensor elements, (ii) generating, with each of the plurality of sensor elements, a first state condition signal, (iii) storing, for each of the plurality of sensor elements, a first data associated with the generated first state condition signal, (iv) individually establishing a second state condition for each of the plurality of sensor elements by connecting the first terminal to the readout circuit and connecting the second terminal to the power source for each of the plurality of sensor elements, (v) generating, with each of the plurality of sensor elements, a second state condition signal, (vi)) storing, for each of the plurality of sensor elements, a second data associated with the generated second state condition signal, and (vii) calculating, for each of the plurality of sensor elements, the respective calculated offset using the stored first data and the stored second data.

18. The magnetic field sensor system of claim 17, the memory further including command instructions for:
identifying a polynomial two-dimensional least-squares fit for the calculated offsets of at least some of the plurality of sensor elements;
generating a smoothed offset for each of the at least some of the plurality of sensor elements based upon the polynomial two-dimension least-squares fit;
determining a sensor system output signal based upon the first data for each of the plurality of sensor elements and the smoothed offset for each of the at least some of the plurality of sensor elements; and
outputting the sensor system output signal.

19. The magnetic field sensor system of claim 18, the memory further including command instructions for:
comparing the calculated offset of each of the plurality of sensor elements to the smoothed offset for each of the at least some of the plurality of sensor elements;
determining, based upon the comparison, if the calculated offset for each of the at least some of the plurality of sensor elements is within a predetermined range of the smoothed offset for each of the at least some of the plurality of sensor elements; and
excluding first data from each of the at least some of the plurality of sensor elements having a calculated offset that is not within the predetermined range of the respective smoothed offset for each of the at least some of the plurality of sensor elements.

20. The magnetic field sensor system of claim 16, further comprising:
a third plurality of switches configured to selectively connect a third sensor element terminal to the power source and to selectively connect the third sensor element terminal to the readout circuit; and
a fourth plurality of switches configured to selectively connect a fourth sensor element terminal to the power source and to selectively connect the fourth sensor element terminal to the readout circuit.

* * * * *